United States Patent [19]

Broom

[11] Patent Number: 5,414,293
[45] Date of Patent: May 9, 1995

[54] ENCAPSULATED LIGHT EMITTING DIODES

[75] Inventor: Ronald F. Broom, Zurich, Switzerland

[73] Assignee: International Business Machines Corporation, Armonk, N.Y.

[21] Appl. No.: 47,989

[22] Filed: Apr. 19, 1993

[30] Foreign Application Priority Data

Oct. 14, 1992 [EP] European Pat. Off. ........... 92810786

[51] Int. Cl.$^6$ .................... H01L 33/00; H01L 27/14; H01L 23/48; H01L 23/02
[52] U.S. Cl. ........................................ 257/433; 257/98; 257/432; 257/667; 257/687; 257/787
[58] Field of Search ................ 257/98, 433, 432, 667, 257/687, 787, 434, 100

[56] References Cited

U.S. PATENT DOCUMENTS

| | | |
|---|---|---|
| 3,786,499 | 1/1974 | Jankowski et al. ............. 340/378 R |
| 4,390,810 | 6/1983 | Biwa ................................ 257/667 |
| 5,052,009 | 9/1991 | Tsuboi et al. .................... 372/36 |
| 5,250,816 | 10/1993 | Kitamura ......................... 257/98 |

FOREIGN PATENT DOCUMENTS

| | | |
|---|---|---|
| 0039017 | 11/1981 | European Pat. Off. ...... C08G 59/42 |
| 0374121 | 10/1989 | European Pat. Off. . |
| 0466975A1 | 12/1990 | European Pat. Off. ...... H01L 33/00 |
| 52-070768 | 6/1977 | Japan .................... 257/687 |
| 56-142657 | 4/1980 | Japan . |
| 60-12782 | 7/1983 | Japan . |
| 59-046846 | 3/1984 | Japan .................... 257/433 |
| 60-217687 | 4/1984 | Japan . |
| 63-131586 | 11/1986 | Japan . |
| 63-244781 | 3/1987 | Japan . |
| 63-052491 | 3/1988 | Japan . |
| 04014888 | 1/1992 | Japan . |
| 04023381 | 1/1992 | Japan . |

OTHER PUBLICATIONS

"UV-Aushartende Epoxies, Klebstoffe und Abdeckmassen" UK-Lichtquellen, Electro'Lite Corp., Polyscience AG, Bleichistrasse, Switzerland.

H. Kaufmann, et al., "Self-Adjusted Permanent Attachment of Fibres to GaAs Waveguide Components" Electronics Letters, vol. 22, No. 12, pp. 642-643 (Jun. 1986).

Primary Examiner—Rolf Hille
Assistant Examiner—T. M. Arroyo
Attorney, Agent, or Firm—H. Daniel Schnurmann

[57] ABSTRACT

Encapsulation of semiconductor light emitting diodes, in particular laser diodes, characterized in that a gap is formed in an encapsulant, which is positioned in front of the light emitting facet of the diode, the gap preventing the encapsulant from adhering to the light emitting facet.

9 Claims, 4 Drawing Sheets

ENCAPSULATED LIGHT EMITTING DIODES

TECHNICAL FIELD

The invention relates to hermetically sealing light emitting diodes, particularly laser diodes, to yield protection from the environment and to simplify packaging.

BACKGROUND OF THE INVENTION

Semiconductor light emitting diodes are know to be highly sensitive to moisture. This sensitivity extends to exposure to chemicals, such as detergents and to mechanical stress. As a result, devices of this nature require encapsulation and protection by appropriate housing which, at the very least, provide appropriate electrical and optical interconnections.

Encapsulation and packaging of light emitting diodes should be simple and inexpensive on one hand, and reliable and durable, on the other. A variety of encapsulations for conventional semiconductor devices have been known to the art. Most of them are not well suited for light emitting diodes in view of their high mechanical complexity. Attempts have been made to reduce the complexity of the housing by using epoxy-like materials for hermetically sealing the diode.

An example of such an encapsulation package is described in the European Patent application, EP-A 0 466 975, "Semiconductor Light-Emitting Device". The principle governing the encapsulation of the light emitting device is schematically illustrated in FIG. 1. Shown is an edge emitting laser diode 10 mounted on a base 11 cube 12 with a 45° mirror facet 13 positioned at a fixed distance from diode 10, thereby providing an optical output port. The laser diode 10 and the cube 12 are sealed and held in a transparent resin 14. The resin 14 adheres to the laser facets and fills the space between the laser 10 and the cube 12. The upper surface of cube 12 is not covered by resin 14. As shown by arrow 15, a light beam emitted from the laser 10 propagates through the resin 14, prior to its being reflected out of the resin.

The light emitting facet, referred to as mirror facet, is a critical element of a light emitting diode when addressing laser diodes. Because of the small emitting area (depending on the design of a light emitting diode), the optical flux density can be quite high ($>1$ MW/cm$^2$). Consequently, corrosion or contamination can easily lead to degradation of the output or melting of the light emitting facet through thermal runaway. Organic encapsulants, such as transparent resin (shown in FIG. 1), have all low thermal conductivity so that only a small degree of absorption can result in the presence of a local temperature rise. For this reason, most of the laser diodes are hermetically sealed in a metal enclosure which ensures that only an inert gas is in contact with the sensitive facets. A disadvantage of hermetically sealing light emitting diodes using an encapsulant is illustrated in FIG. 1. In it, the encapsulant adheres to the light emitting facet. Thus, it directly interacts with it and causes thermal problems if light beams with high optical flux density are to be generated. Furthermore, chemical changes in the encapsulant caused by high optical flux, can accelerate degradation (corrosion) of the facet.

OBJECTS AND SUMMARY OF THE INVENTION

Accordingly, it is an object of the present invention to provide an hermetic encapsulation of light emitting diodes which overcomes the disadvantages of known encapsulations.

It is another object of the present invention to provide a simple, reliable and low cost encapsulation technique.

In accordance with the invention, the above objects are accomplished by providing an 'air' gap or a region having an inert gas in direct contact with the light emitting facet of a light emitting diode while leaving the remaining portions of the diode sealed in the encapsulant.

BRIEF DESCRIPTION OF THE DRAWINGS

The invention is described in detail below with reference to the following drawings, which are schematic in nature and not drawn to scale, and wherein some particular dimensions have been exaggerated for the sake of clarity.

A bonding the laser diode to a mounting base and placing a thin foil in front of the mirror;

B sealing the laser diode, wherein the thin foil serves as a dam; and

C removing the foil and covering the whole structure with an encapsulant.

FIG. 4 shows the following sequence of steps of the encapsulation of an edge emitting laser diode and an optical fiber, in accordance with a second embodiment of the present invention:

A bonding the laser diode to a mounting base and placing an optical fiber in a groove;

B placing a thin foil in front of the mirror of the laser diode and pushing the fiber against it; and C removing the foil and covering the whole structure with an encapsulant to seal the structure.

FIG. 5 shows the following sequence of steps of the encapsulation of an edge emitting laser diode and an optical lens, in accordance with a third embodiment of the present invention:

A mounting the laser diode on a mounting base;

B placing a thin foil in front of the mirror of the laser diode, covering the structure with a sealing cap and inserting a lens;

C turning the whole structure and partially filling it with an encapsulant; and

D removing the foil and filling the sealing cap with an encapsulant.

DETAILED DESCRIPTION OF THE INVENTION

Prior to describing alternate embodiments of the present invention, various materials used as encapsulants will be described separately. These materials, which have to be transparent when being positioned in the path of light, should be durable and easy to handle. Typical materials are cyclic alipathic epoxy resins, diglycidyl esters, polyurethans, and polymethyl methacrylates (PMMA), to name only a few. Different diglycidyl esters are described in the European Patent EP-B 0 039 017, "Verfahren zur Herstellung transparenter Giessharze". Additional information is available from manufacturers of optical resins or from their distributors. By way of example, a listing of some resins is given in a leaflet, published by Polyscience AG, Bleichistrasse 8, CH-6300 Zug/Switzerland, titled "UV-aushärtende Epoxies, Klebstoffe and Abdeckmassen". (Polyscience AG is a distributor of products of the Electro-Lite Corporation, Danbury, Conn.).

Figure 1:
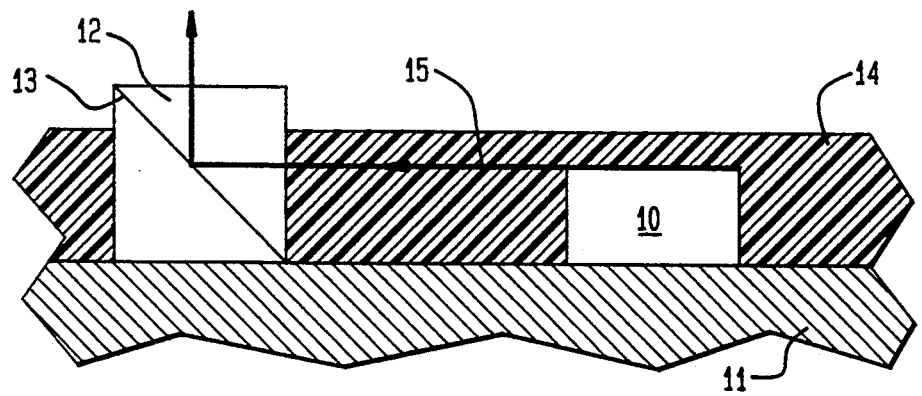
FIG. 1 shows a schematic cross-section of a prior art edge emitting laser diode and an optical output port sealed in transparent resin.
Figure 2:
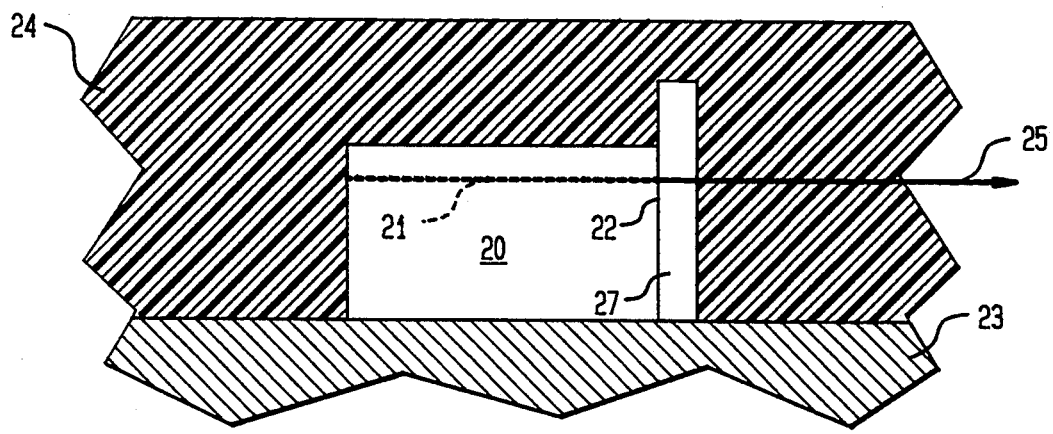
FIG. 2 shows a schematic cross-section of an edge emitting laser diode encapsulated in an 'air' gap in front of the mirror facet, according to a first embodiment of the present invention.

A first embodiment of the present invention is described in FIG. 2. This Figure shows a schematic cross-section through a module comprising an edge emitting laser diode 20, its active layer (dashed line 21) being placed on and bonded to a mounting base 23. The complete laser diode 20 is encapsulated in transparent resin 24 providing a narrow 'air' gap 27 in front of and in direct contact to laser mirror 22. The width of the 'air' gap is typically less than 1000 µm and, preferably, between 5 µm and 100 µm. The hermetically sealed gap 27 ensures an environment of optimum conditions being decoupled from the surrounding environment. The laser mirror 22, after encapsulation, is not exposed to chemicals or to mechanical stress/strain. Further packaging of this diode encapsulated in accordance with the present invention, can be done by employing conventional metal housings with window, as described in U.S. Pat. No. 5,052,009, "Semiconductor Laser Device and Process of Assembling the Same".

Figure 3A:
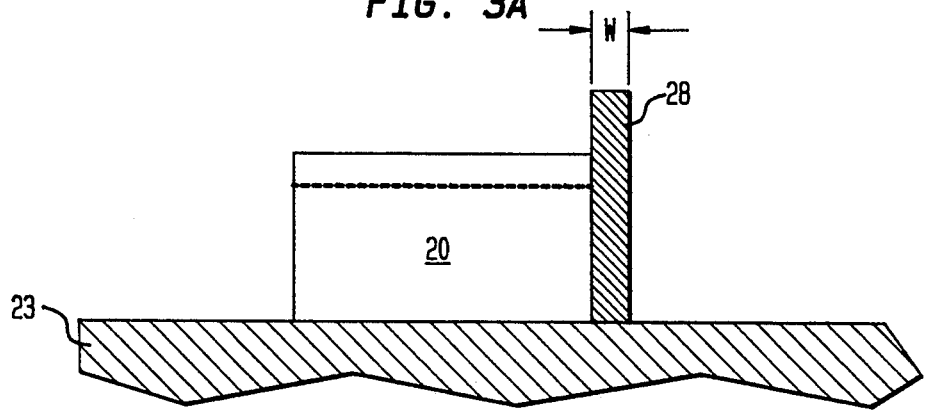
FIG. 3 shows the following sequence of steps of the encapsulation of an edge emitting laser diode, in accordance with the first embodiment of the present invention.
Figure 3B:
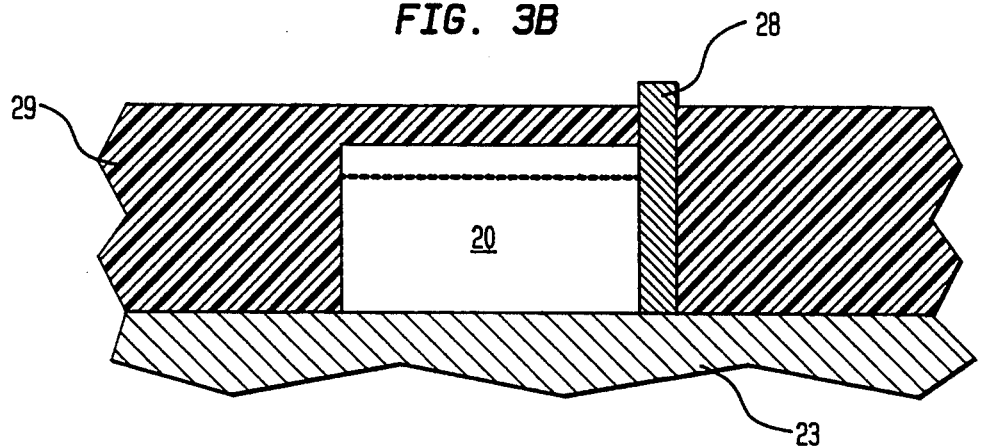
Figure 3C:
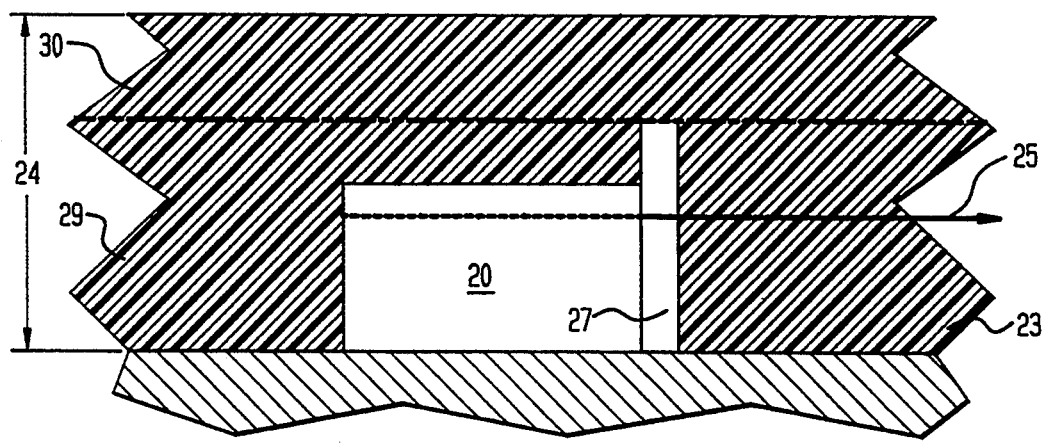

The method of encapsulating laser diode 20 is explained in context with FIGS. 3A-3C, that illustrate intermediate steps of the encapsulation. As shown in FIG. 3A, a laser diode 20 is mounted with its junction-side-up, also referred to as epi-side-up, on top of mounting base 23. The laser diode 20 is preferably bonded to this mounting base 23. A thin foil 28 of well defined thickness w is placed and fixed in front of mirror facet of laser 20. This foil 28 requires being held in place during the next step, preferably by means of clamps. Next, laser diode 20 and foil 28 are sealed in a first encapsulant 29. This encapsulant should be transparent for the particular wavelength emitted by the laser, and such that a light beam emitted can pass through the encapsulant 29 nearly unattenuated. As shown in FIG. 3B, the upper portion of the foil 28 remains uncovered, the foil serving as a dam. Prior to finally encapsulating the whole structure, the foil 28 has to be removed after the first encapsulant has hardened. This can be done by etching, by dissolving it in a suitable solvent, or by mechanically removing it. After removal of foil 28, a narrow gap 27 is left in direct contact to the mirror, the width of the gap 27 being defined by the foil thickness w. To complete the encapsulation, a further layer of an encapsulant 30 is laid over the structure covering the gap 27, as shown in FIG. 3C. The trapped air or inert gas, e.g., nitrogen, in gap 27 prevents ingress of this additional layer 30. An encapsulant of high viscosity and narrow gap width is chosen. The process is preferably carried out in a vacuum environment. Rapid application and accelerated hardening, e.g., using a source of UV-light ensures that the encapsulant is not drawn into the gap.

Figure 4A:
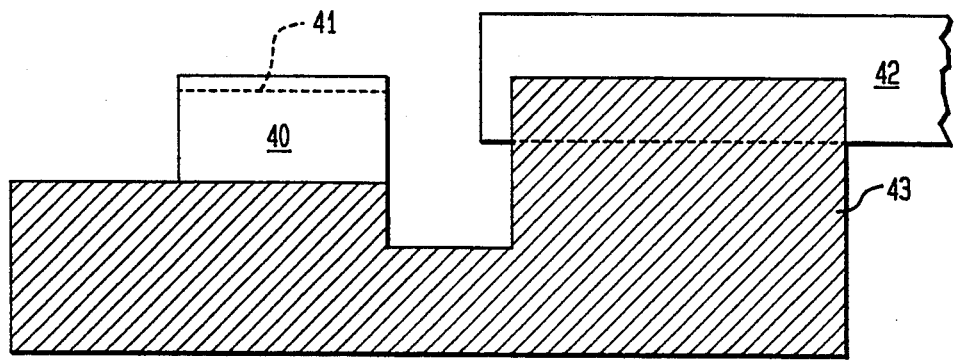
Figure 4B:
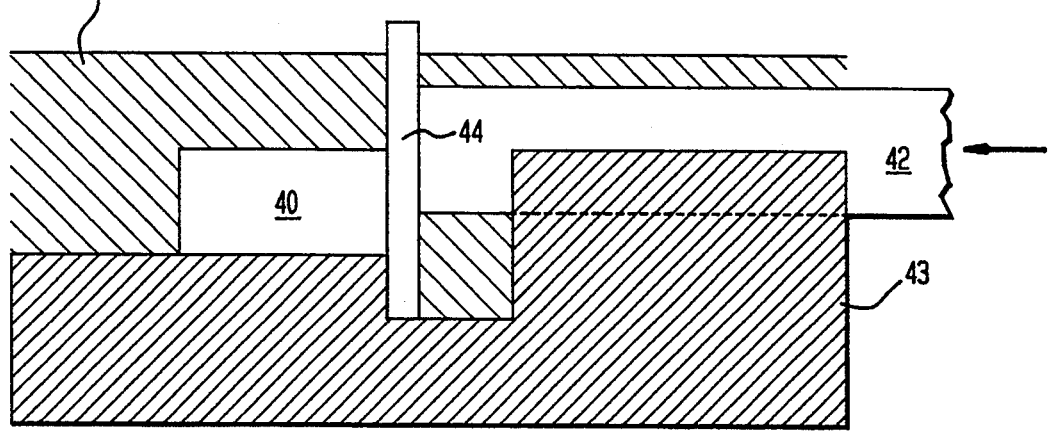
Figure 4C:
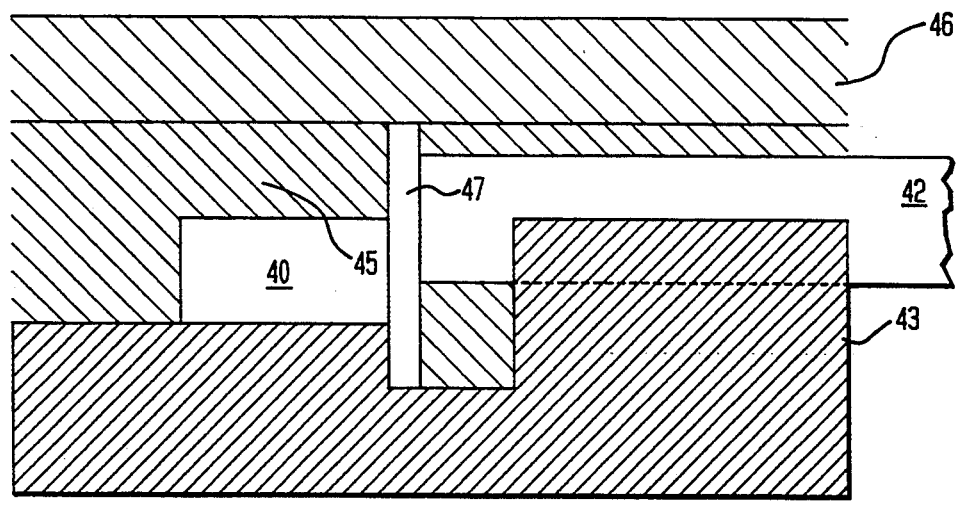

In accordance with the context of the first embodiment, the laser is completely sealed, but no epoxy or other encapsulant comes in contact with the laser mirror. In this particular embodiment, however, an encapsulant is present in the optical light path. As can be seen in FIGS. 4A-4C, other embodiments exist that eliminate the encapsulant from the optical path.

The second embodiment, described in connection with FIGS. 4A-4C, relates to an edge emitting laser diode 40 coupled to an optical fiber 42 serving as optical output port. As illustrated in FIG. 4A, said laser 40 is mounted junction-side-up, the dashed line representing the active layer 41 on top of a structured mounting base 43. This base 43 is structured to provide a mounting area to which the laser 40 can be bonded to an alignment support for the fiber 42, which itself is part of the mounting base 43 or is attached to it. A recess may be positioned between the laser mounting area and the alignment support. The alignment support is shaped such that the fiber has only one degree of freedom, i.e., perpendicular to the plane of the laser mirror. This can be achieved by providing a v-shaped groove in the alignment support, as known from various publications such as: "Self-Adjusted Permanent Attachment of Fibers to GaAs Waveguide Components", by H. Kaufmann et al., Electronics Letters, Vol. 22, No. 12, June 1986, pp. 642–643.

A thin foil 44 is placed between the mirror and the fiber 42, with the latter used for clamping the foil 44 gently against the surface of the mirror. This is achieved by pushing the fiber 42 towards the laser 40, as shown by the arrow on the right hand side of FIG. 4B. Similar to the first step of encapsulation, described in context with the first embodiment, an encapsulant 45 is flowed over laser 40 and fiber 42, with the foil 44 acting as a dam. This intermediate step is schematically shown in FIG. 4B. After this encapsulant 45 has hardened, the foil 44 is removed by suitable means, as already described. A narrow gap 47 is left between the laser mirror and the fiber 42, with the width defined by the foil thickness. The encapsulation is completed by applying a second encapsulation layer 46. As can be seen in FIG. 4C, no encapsulant remains in the optical path when the complete laser is totally covered. Thus, efficient optical coupling is ensured by this technique. The alignment between the fiber 42 and the laser 40 is highly reproducible and precise.

Figure 5A:
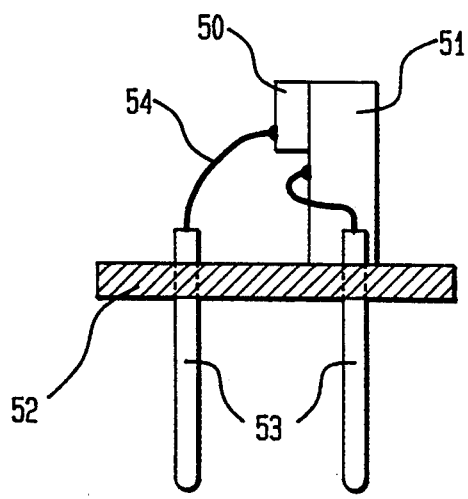
Figure 5B:
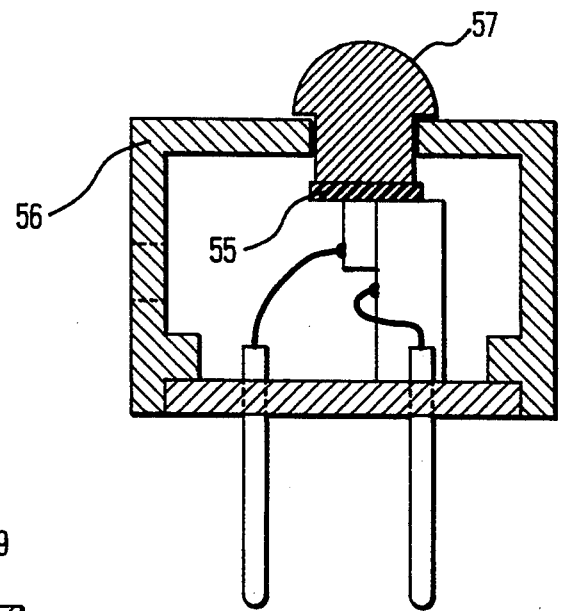
Figure 5C:
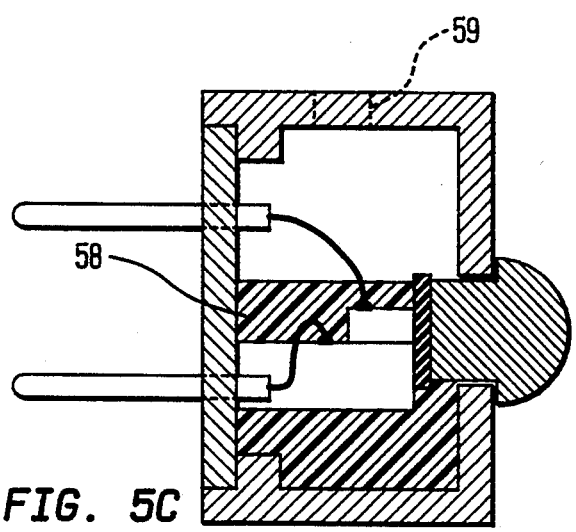
Figure 5D:
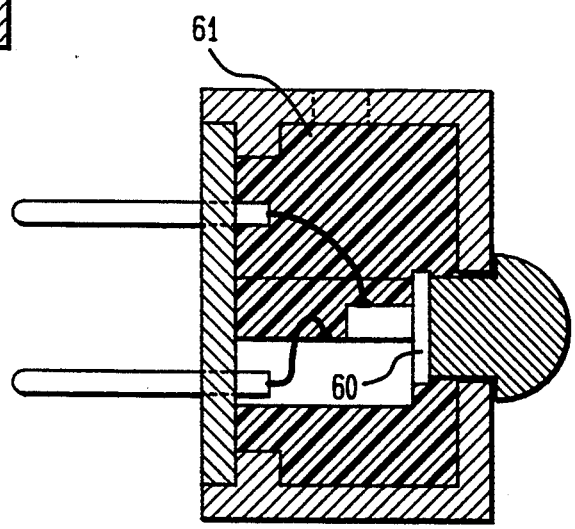

A third embodiment of the present invention is illustrated in connection with FIGS. 5A through 5D. These Figures describe the complete packaging of laser diode 50. Prior to encapsulating laser diode 50, it must be bonded to a substrate 51. This substrate 51 is connected to a base plate 52 with metal pins 53. The upper ends of these metal pins 53 are connected by means of wires 54 to laser contact metallizations (not shown). Next, a thin soluble foil 55 is placed on top of the front mirror of laser 50 such that it covers at least the light emitting portion thereof. A cylindrical sealing cap 56, preferably made of metal with a window in its upper portion, is positioned on top of baseplate 52. An optical lens 57, preferably in the shape of a mushroom, is inserted from outside the sealing cap of the window. The size of the window and the lens are chosen such that the lens 57 can be moved up and down. It is clamped in place by pressing lens 57 against foil 55. As shown in FIG. 5C, the complete structure is now tilted 90°. Similar to the steps already described in context with the first and second embodiment, an encapsulant 58 is now flowed over laser 50 mounted on substrate 51, and over foil 55 and lens 57. This liquid encapsulant is preferably poured into the inner portion of the sealing cap 56 via an opening 59. After encapsulant 58 has hardened, either the sealing cap 56 is removed by bringing the foil 55 in contact with a suitable solvent, or the solvent is directly filled into the sealing cap using opening 59. After this step, a narrow gap is left between the laser mirror and the lens 57. The remaining portion of the sealing cap 56, back to its original position, is now filled with an encapsulant 61. It should be ensured that the gap 60 is not filled with this encapsulant 61.

While alternate preferred embodiments of the invention have been described, it is understood that various substitutes and modifications can be introduced without departing from the spirit of the invention. Some of these modifications are:

- Alternate types of light emitting diodes, such as surface emitting diodes, arrays of laser diodes, etc., can be encapsulated in accordance with the present invention;
- The shape, size, thickness, and material of the foil, placed in front of the light emitting facet, must be chosen to best suit the appropriate environment;
- The light emitting diode can either be mounted epi-side-up or epi-side-down, whichever allows better packaging and cooling;
- The mounting base and fiber alignment support can be modified, if necessary;
- Conventional or specially designed baseplates and sealing caps can be used;
- Multimode fibers, single mode fibers, fiber arrays, rod lenses, focusing or spreading lenses, simple plane windows or other optical means, such as beam splitters can be coupled to and encapsulated with a light emitting diode.

By the above described means, light emitting diodes are completely sealed, but no encapsulant comes in contact with their light emitting facets. To summarize, the described packaging technique makes possible the use of a wide variety of different encapsulants. The resultant reduction in complexity and cost on one hand, combined with increased device lifetime and improved reliability, extends the range of applications of these devices.

What is claimed is:

1. An optical module comprising:
   a semiconductor light emitting diode mounted on a base and having a light emitting facet that includes a light emitting portion; and
   means for encapsulating and sealing said diode, wherein a gap contiguous to the light emitting facet of said diode is formed in said means for encapsulating, wherein
   at least said light emitting portion of said light emitting facet is placed in a defined atmosphere and remains free from said means for encapsulating, and wherein
   said gap has a width between 5 $\mu$m and 100 $\mu$m.

2. The optical module as recited in claim 1, further comprising at least one optical output port which is positioned such that said gap is placed between the light emitting portion of said light emitting facet and said optical output port to provide an optical path starting at the light emitting portion of the light emitting facet of said diode, passing through the gap, and leaving the module via the optical output port.

3. The optical module as recited in claim 1, wherein said light emitting diode is a laser diode, and wherein said light emitting facet thereof is a facet that defines a cavity in the laser.

4. The optical module as recited in claim 2, further comprising an optical fiber for providing an optical output port, said fiber being aligned with respect to the light emitting portion of the diode, and wherein the optical path starts at the light emitting portion, passes through the gap into said optical fiber and exits the module via said fiber.

5. The optical module as in claim 4, wherein said fiber is prealigned in an alignment support having a v-shaped groove, its main axis being substantially perpendicular to the light emitting facet of the diode, and wherein said alignment support is integral to the mounting base.

6. The optical module as recited in claim 1, further characterized in that said encapsulating means is selected from a group that consists of cyclic alipathic epoxy resin, diglycidyl ester, polyurethan, and polymethyl methacrylate (PMMA).

7. The optical module as recited in claim 1, wherein said gap is placed under vacuum conditions.

8. The optical module as recited in claim 1, wherein said gap is filled with inert gas.

9. The optical module as recited in claim 1, wherein said gap is filled with air.

* * * * *